(12) United States Patent
Shioda et al.

(10) Patent No.: US 8,728,237 B2
(45) Date of Patent: May 20, 2014

(54) CRYSTAL GROWTH METHOD FOR NITRIDE SEMICONDUCTOR HAVING A MULTIQUANTUM WELL STRUCTURE

(75) Inventors: Tomonari Shioda, Kawasaki (JP); Toshiki Hikosaka, Tokyo (JP); Yoshiyuki Harada, Tokyo (JP); Koichi Tachibana, Kawasaki (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 930 days.

(21) Appl. No.: 12/874,594

(22) Filed: Sep. 2, 2010

(65) Prior Publication Data
US 2011/0197808 A1   Aug. 18, 2011

(30) Foreign Application Priority Data

Feb. 17, 2010 (JP) .................................. 2010-032630

(51) Int. Cl.
*C30B 25/02* (2006.01)

(52) U.S. Cl.
USPC ............. 117/89; 117/84; 117/88; 117/90; 117/93; 117/94; 117/102; 117/104; 117/105; 117/106; 438/22; 438/34; 438/46; 438/47; 438/478; 438/507

(58) Field of Classification Search
USPC ............. 117/84, 88–90, 93–94, 102, 104, 117/105–106, 952; 438/22, 34, 46–47, 478, 438/507
See application file for complete search history.

(56) References Cited

FOREIGN PATENT DOCUMENTS

| JP | 2002-43618 | 2/2002 |
| JP | 2008-28121 | 2/2008 |

OTHER PUBLICATIONS

S.M. Ting, et al. Publication entitled "Morphological evolution of InGaN/GaN quantum-well heterostructures grown by metalorganic chemical vapor deposition," Journal of Applied Physics, vol. 94, pp. 1461-1467 (2003).*

H. Ishikawa, et al. Publication entitled "Suppression of GaInN/GaN multi-quantum-well decomposition during growth of light-emitting diode structure," Japanese Journal of Applied Physics, vol. 40, pp. L1170-L1172 (2001).*

N. Duxbury, et al. publication entitled "Effects of carrier gas on the properties of InGaN/GaN quantum well structures grown by MOCVD," Phys. Stat. Sol. B, vol. 216, pp. 355-359 (1999).*

(Continued)

*Primary Examiner* — Michael Kornakov
*Assistant Examiner* — Kenneth A Bratland, Jr.
(74) *Attorney, Agent, or Firm* — Oblon, Spivak, McClelland, Maier & Neustadt, L.L.P.

(57) ABSTRACT

A method for growing nitride semiconductor crystals contains: growing a first semiconductor layer containing $In_xGa_{1-x}N$ ($0 < x \leq 1$) on a substrate at a first growth temperature, using a first carrier gas containing an inert gas; growing a second semiconductor layer containing $In_yGa_{1-y}N$ ($0 \leq y < 1$, $y < x$) on the first semiconductor layer at a second growth temperature higher than the first growth temperature, using a second carrier gas containing the inert gas and $H_2$ gas, an amount of the $H_2$ gas being smaller than an amount of the inert gas; and growing a third semiconductor layer containing $In_zGa_{1-z}N$ ($0 \leq z < 1$, $z < x$) on the second semiconductor layer at the second growth temperature, using a third carrier gas containing the inert gas and $H_2$ gas, an amount of the $H_2$ gas in the third carrier gas being a smaller than the amount of $H_2$ gas in the second carrier gas.

7 Claims, 5 Drawing Sheets

(56) References Cited

OTHER PUBLICATIONS

S. M. Ting et al., "Morphological evolution of InGaN/GaN quantum-well heterostructures grown by metalorganic chemical vapor deposition", Journal of Applied Physics, vol. 94, No. 3, Aug. 1, 2003, 7 pages.
U.S. Appl. No. 12/875,503, filed Sep. 3, 2010, Hikosaka, et al.
U.S. Appl. No. 13/029,416, filed Feb. 17, 2011, Hikosaka, et al.

* cited by examiner

CRYSTAL GROWTH METHOD FOR NITRIDE SEMICONDUCTOR HAVING A MULTIQUANTUM WELL STRUCTURE

CROSS-REFERENCE TO RELATED APPLICATION

This application is based upon and claims the benefit of priority from prior Japanese Patent Application No. 2010-32630 filed on Feb. 17, 2010 in Japan, the entire contents of which are incorporated herein by reference.

FIELD

Embodiments described herein relate to a crystal growth method for nitride semiconductors.

BACKGROUND

Light emitting diodes (LEDs) using nitride semiconductor materials have low toxicity, and characteristically have high efficiencies and long lives. Such LEDs are used in display devices, signals, and lightings, and are available as products in the market. Laser diodes (LDs) using nitride semiconductor materials are used in light sources for performing writing on and reading from high-density memory disks, and are available as products in the market.

By applying a multiquantum well (hereinafter also referred to as MQW) structure of $In_xGa_{1-x}N$ to an active layer of a nitride semiconductor, a high-efficiency light emitting device having a high luminance can be formed. In a typical quantum well structure, a 1.5 nm to 5 nm material mainly containing $In_xGa_{1-x}N$ is used for the quantum well layer, and GaN is mainly used for the barrier layer, to achieve high-luminance light emission. Particularly, the luminous efficiency and emission wavelength can be varied by changing the composition ratio x of In as a group III element forming the quantum well layer and changing the thickness of the quantum well layer. For example, by increasing the composition ratio x of In in the quantum well layer, light emission of longer wavelengths can be achieved.

To form the above described MQW, it is necessary to successively form $In_xGa_{1-x}N$ layers containing different amounts of In from one another. To grow GaN by conventional metal organic vapor phase epitaxy (MOVPE) under optimum conditions, the growth temperature should be in the range of 1000° C. to 1200° C., and a $H_2$ gas should be used as the carrier gas. Meanwhile, to grow InN under optimum conditions, the temperature should be in the range of 500° C. to 650° C., and a $N_2$ gas should used as the carrier gas. There are great differences in growth conditions between the two, and there are many problems in the crystal growth of $In_xGa_{1-x}N$ mixed crystals. For example, since the optimum growth temperature of InN is much lower than the optimum growth temperature of GaN, an even lower temperature is required in the crystal growth of an $In_xGa_{1-x}N$ layer having a higher In composition ratio. In a case where a GaN layer to be a quantum well layer requiring a high temperature is successively grown after an $In_xGa_{1-x}N$ layer to be a quantum well layer such a low temperature is grown, many pits (holes) and clusters (also called protrusions or inclusions) are formed in the surface, and many defects are induced. As a result, a high-efficiency light emitting device having a high luminance cannot be obtained. This problem becomes even more serious in cases where an even lower temperature is required for the growth or where the composition ratio of In needs to be made higher. For example, in a case where a MQW that emits green, yellow, orange, or red light is grown, which has a longer wavelength than blue light, this problem becomes prominent.

Meanwhile, there has been a known technique by which an InGaN quantum well layer is grown at a growth temperature of 700° C. with the use of a $N_2$ gas as the carrier gas, the growth temperature is then raised, and $H_2$ gas is added to the carrier gas of $N_2$ at a growth temperature of 900° C., thereby, a GaN barrier layer is grown.

DETAILED DESCRIPTION

Certain embodiments provide a crystal growth method for nitride semiconductors, including: growing a first semiconductor layer containing $In_xGa_{1-x}N$ (0<x≤1) on a substrate at a first growth temperature, with the use of a first carrier gas formed with an inert gas; growing a second semiconductor layer containing $In_yGa_{1-y}N$ (0≤y<1, y<x) on the first semiconductor layer at a second growth temperature higher than the first growth temperature, with the use of a second carrier gas containing the inert gas and $H_2$ gas, an amount of the $H_2$ gas being smaller than an amount of the inert gas; and growing a third semiconductor layer containing $In_zGa_{1-z}N$ (0≤z<1, z<x) on the second semiconductor layer at the second growth temperature, with the use of a third carrier gas containing the inert gas and $H_2$ gas, an amount of the $H_2$ gas in the third carrier gas being a smaller than the amount of $H_2$ gas in the second carrier gas.

Before an embodiment is described, the embodiment is outlined in the following.

The inventors made intensive studies on a crystal growth method for multiquantum wells (MQW), to prevent enlargement of pits and restrain generation of clusters. As a result, the inventors made the following discoveries about a method for growing a nitride semiconductor layer of elements serving as a barrier layer that mainly contained Ga and contained no In or a small amount of In (hereinafter referred to as the GaN layer), and a nitride semiconductor layer of elements serving as a well layer that contained more In than that of the GaN layer, and mainly contained In and Ga (hereinafter referred to as the InGaN layer).

1. Clusters are removed by adding $H_2$ gas only in the initial stage of formation of the GaN layer.

2. After that, the GaN layer is grown at a higher temperature than the growth temperature of the InGaN layer without the addition of $H_2$ gas to the carrier gas. The temperature is then lowered again, and the InGaN layer is grown, to obtain a flat crystal surface.

The inventors found that a MQW with excellent crystal quality could be formed by repeating those procedures to crystal-grow the MQW, and a light emitting device having a high luminance could be manufactured.

Figure 1:
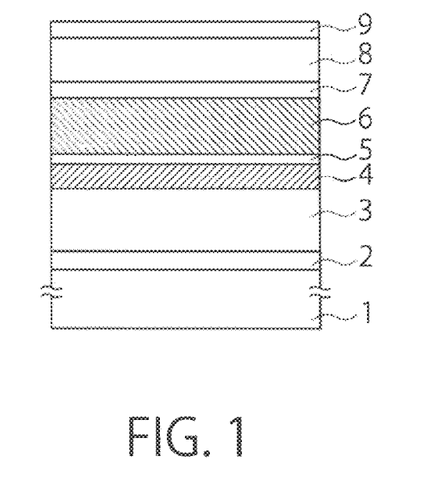
FIG. 1 is a cross-sectional diagram of a semiconductor light emitting device that is formed according to a crystal growth method of an embodiment.

Hereafter, a crystal growth method for nitride semiconductors according to an embodiment will be described with reference to FIG. 1. A nitride semiconductor that is grown by the crystal growth method of the embodiment is a semiconductor light emitting device having a MQW structure, and FIG. 1 is a cross-sectional diagram of the semiconductor light emitting device. This semiconductor light emitting device has a structure in which a GaN buffer layer 2, a GaN layer 3, a stack film 4 having $In_{0.08}Ga_{0.92}N$ layers and GaN layers alternately stacked, a Si-doped n-type GaN layer 5, a MQW layer 6 having $In_{0.18}Ga_{0.82}N$ layers and GaN layers alternately stacked, a Mg-doped p-type AlGaN layer 7, a Mg-doped p-type GaN layer 8, and a p-type GaN layer 9 doped with Mg at a high density are stacked in this order on a sapphire substrate 1 having a (0001) upper plane. Each of the semiconductor layers constituting this semiconductor light emitting device is grown by MOVPE (Metal Organic Vapor Phase Epitaxy). As the source and dopant materials of the atoms forming each of the semiconductor layers, the following raw materials can be used.

Examples of Ga raw materials include TMGa (trimethylgallium) and TEGa (triethylgallium). Examples of In raw materials include TMIn (trimethylindium). Examples of Al raw materials include TMAl (trimethylaluminum). Examples of N raw materials include $NH_3$ (ammonia). Examples of Si raw materials include $SiH_4$ (monosilane). Examples of Mg raw materials include $Cp_2Mg$ (cyclopentadienylmagnesium).

First, thermal cleaning is performed on the sapphire (0001) substrate 1 at a susceptor temperature of 1100° C. The susceptor temperature is then lowered to 500° C., and the GaN buffer layer 2 is grown on the sapphire substrate 1. After the susceptor temperature is raised to 1120° C., the GaN layer 3 is grown at a high temperature. Other than a sapphire (0001) substrate, a SiC substrate or a GaN substrate may be used as the substrate 1. It is also possible to use another plane of a sapphire substrate, other than the (0001) plane.

After that, the carrier gas is switched from a $H_2$ gas to a $N_2$ gas, and the susceptor temperature is lowered to 850° C. As a buffer layer of active layers, the stack film 4 having a stack structure formed by repeating ten cycles of stacking of an $In_{0.08}Ga_{0.92}N$ layer and a GaN layer is grown. The Si-doped n-type GaN layer 5 is then grown at the same temperature. It is preferable to have a stack structure that is formed by stacking an InGaN layer and a GaN layer several times and is used as a buffer layer of active layers. However, the same effects as above can be achieved without such a stack structure, as long as an active layer is grown on a nitride semiconductor.

After that, the MQW layer 6 having a stack structure formed by repeating four cycles of stacking of an $In_{0.18}Ga_{0.82}N$ layer and a GaN layer is grown. The carrier gas is then switched from a $N_2$ gas to a $H_2$ gas, and the Mg-doped AlGaN layer 7 is grown at 1020° C. At the same growth temperature, the Mg-doped GaN layer 8 and the GaN layer 9 doped with Mg at a high density are sequentially grown.

Figure 2:
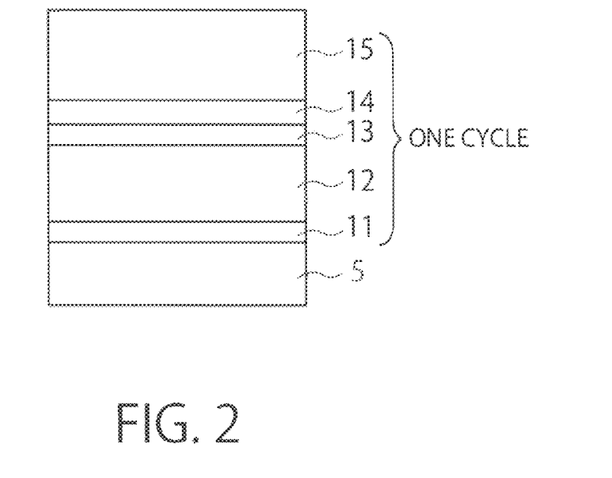
FIG. 2 is a cross-sectional diagram showing a quantum well layer that is formed according to the crystal growth method of an embodiment.
Figure 3:
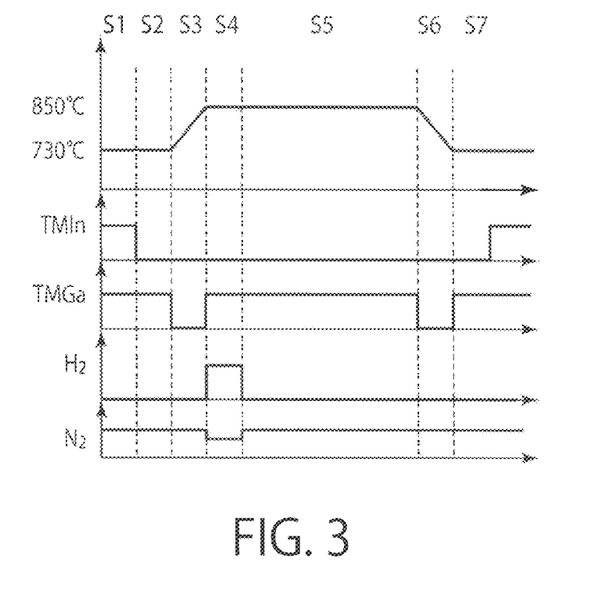
FIG. 3 is a diagram showing the sequences of the materials, carrier gases, and temperatures in the crystal growth of a MQW layer according to an embodiment.

Referring now to FIGS. 2 and 3, the procedures for growing the MQW layer 6 according to the crystal growth method of the embodiment are described in greater detail. FIG. 2 is a cross-sectional diagram showing the MQW layer 6, and FIG. 3 is a diagram showing the sequences of each material, each carrier gas, and each temperature in the crystal growth of the MQW layer 6.

In the crystal growth of the MQW layer 6, the flow rate of $N_2$ gas is 20400 sccm, the flow rate of $NH_3$ is 18600 sccm, and the total flow rate of gases to be supplied into the reacting furnace is maintained at 39000 sccm, for example. The flow rate of $N_2$ gas is partially supplied to a bubbler such as TMGa or TMIn. As the carrier gas, it is preferable to use a $N_2$ gas that is an inert gas, but an Ar or He gas may be used, instead of a $N_2$ gas.

First, the susceptor temperature is set at 850° C., and TMGa and $NH_3$ are supplied as materials into the reacting furnace, to grow the Si-doped n-type GaN layer 5 to be the base layer. After that, the crystal growth is suspended, and the susceptor temperature is lowered to 730° C., to grow a GaN layer 11 of 3 nm in film thickness. At this point, the supplies of the raw material gases of TMGa and $NH_3$ and the carrier gas of $N_2$ into the reacting furnace are maintained, without a halt. As shown in step S1 of FIG. 3, at the susceptor temperature of 730° C., an $In_xGa_{1-x}N$ (0<x≤1) layer 12 of 2.5 nm to serve as a quantum well layer is grown by further adding a raw material gas of TMIn to the supplies of the raw material gases of TMGa and $NH_3$ and the carrier gas of $N_2$. The composition ratio x in the quantum well layer varies with a desired emission wavelength, but is preferably 0.5 or smaller. This is because a growth of an $In_xGa_{1-x}N$ layer having x larger than 0.5 has large lattice mismatch between the layer and the base GaN layer, and tends to cause the problem of relaxation of strain. The GaN layer 11 may not be grown prior to the growth of the $In_xGa_{1-x}N$ layer 12. In that case, however, it takes time to lower the growth temperature, and the crystal surface might deteriorate during that time. Therefore, the GaN layer 11 is grown beforehand at the same temperature as the quantum well layer, and the $In_xGa_{1-x}N$ layer 12 is grown immediately after that, thereby, a MQW layer with higher quality can be obtained. Although the $In_xGa_{1-x}N$ layer 12 is grown at 730° C. in the embodiment, it may be grown at a temperature between 550° C. and 900° C. If the temperature belows 550° C., the decomposition efficiency of $NH_3$ becomes extremely low, and droplets are easily formed. If the temperature exceeds 900° C., the crystal growth of InGaN is difficult, due to thermal decomposition. The crystal growth temperature for obtaining an In composition ratio necessary for obtaining blue or green light emission is preferably 700° C. or higher, but is lower than 850° C. The width of the $In_xGa_{1-x}N$ layer 12 is preferably in the range of 1 nm to 10 nm, and more preferably in the range of 1.5 nm to 5 nm.

Next, as shown in step S2 of FIG. 3, the supply of the raw material gas of TMIn is stopped, and a GaN layer 13 of 3 nm in film thickness is grown at the susceptor temperature of 730° C. The GaN layer 13 may not be grown. Where the GaN layer 13 is grown before a temperature rise, however, decomposition of the $In_xGa_{1-x}N$ layer 12 can be restrained at the time of the later described temperature rise, and a MQW layer with higher quality is obtained.

As shown in S3 of FIG. 3, the susceptor temperature is then raised to 850° C. Although the crystal growth of the GaN layer 13 is suspended at the time of the temperature rise in the embodiment, the temperature may be raised while the GaN layer 13 is being grown.

As shown in step S4 of FIG. 3, a GaN layer 14 of 3 nm in film thickness is then grown, while 250 sccm of $H_2$ gas as well as the carrier gas of $N_2$ and the raw material gases of TMGa and $NH_3$ are being supplied to the reacting furnace. At this point, the supply of the $N_2$ gas is reduced by the amount of the $H_2$ gas added, so that the total gas supply becomes 39000 sccm. In this example, the supply of the $N_2$ gas is 20150 sccm (=20400−250). The flow rate of the $H_2$ gas is preferably between 0.01% and 50% of the total flow rate. If the flow rate of the $H_2$ gas is lower than 0.01%, the effect to remove clusters by virtue of the addition of $H_2$ gas becomes smaller. If the flow rate of the $H_2$ gas is higher than 50%, the $In_xGa_{1-x}N$ layer 12 is decomposed, and pits become larger. The grown film thickness of the GaN layer 14 with $H_2$ gas added varies with the amount of $H_2$ gas added, and may have any value as long as it contributes to removal of clusters and does not enlarge the pits. However, the film thickness of the GaN layer 14 is preferably 5 nm or smaller. If the film thickness of the GaN layer 14 is larger than 5 nm, the thickness of the barrier layer becomes too large, and puts restrictions on the design of the MQW structure. It is considered that the film thickness of the GaN layer 14 should be substantially equivalent to the height of clusters, but the present invention is not limited to that.

After that, as shown in step S5 of FIG. 3, while the susceptor temperature is maintained at 850° C., the supply of the $H_2$ gas is stopped, and the carrier gas is exclusively the $N_2$ gas. A GaN layer 15 of 9.5 nm in film thickness is then grown. Although the supply of the $H_2$ gas is stopped when the GaN layer 15 is grown, a $H_2$ gas having a total flow rate of less than 0.01% may be supplied. Also, the GaN layer 15 has any film thickness as long as it is thick enough to fill the pits and contributes to flattening. However, the film thickness of the GaN layer 15 should preferably be in the range of 3 nm to 20 nm. A great film thickness can effectively fill the pits and contribute to flattening the surface. However, a great film thickness puts restrictions on the design of the well layer. Although the growth temperature of the GaN layer 15 to be a barrier layer is 850° C. in the embodiment, it should only be higher than the growth temperature of the quantum well layer, and may be in the range of 800° C. to 1200° C., more preferably 850° C. to 950° C. In the range of the temperature, if the growth temperature of the GaN layer 15 is higher than the growth temperature of the well layer by 50° C. or more, high crystal quality is easily obtained. If the growth temperature is lower than 800° C., pits become larger during the growth, and it is difficult to obtain a flat film. If the growth temperature is higher than 950° C., it takes time for the temperature to rise, and the crystal quality of the $In_xGa_{1-x}N$ layer 12 becomes poorer due to decomposition or the like. If the crystal growth temperature is higher than 1200° C., it exceeds the decomposition temperature of the GaN layer 15, and is not suitable as a crystal growth temperature. The barrier layer should be a nitride semiconductor having higher bandgap energy than the well layer, and may be doped with impurities. If the barrier layer is formed with GaN, the crystal quality becomes high, and a crystal growth can be easily achieved.

As shown in step S6 of FIG. 3, the susceptor temperature is again lowered to 730° C. At this point, the supply of the raw material gas of TMGa is stopped in the embodiment. After that, the raw material gas of TMGa is supplied to the reacting furnace, and the above described GaN layer 11 is grown (step S7 of FIG. 3). The procedures of steps S1 through S6 are repeated. The procedures for growing the GaN layer 11 through the GaN layer 15 are repeated four times, to form the MQW layer 6.

Although GaN layers are used as the barrier layers 14 and 15 in the embodiment, $In_yGa_{1-y}N$ (0≤y<1, y<x) layers or $In_zGa_{1-z}N$ (0≤z<1, z<x) layers each having a lower In composition ratio than the $In_xGa_{1-x}N$ (0<x≤1) layer 12 may be used to achieve the same effects as those of the embodiment. Here, y and z are preferably 0.1 or smaller, to avoid relaxation of strain.

Next, Comparative Examples 1 through 4 of the embodiment is described. Each Comparative Example involves the same procedures as those of the embodiment, except for the formation of the MQW layer 6. Therefore, only the formation of the MQW layer will be described in the following.

Comparative Example 1

The crystal growth method of Comparative Example 1 is the same as the crystal growth method of the embodiment, except that the procedures for growing the GaN layer 11, the GaN layer 13, and the GaN layer 14 shown in FIG. 2 are skipped in the crystal growth of the MQW layer, and after the $In_xGa_{1-x}N$ (0<x≤1) layer 12 to be the quantum well layer is grown, the GaN layer 15 is grown at the temperature (=730° C.) at which the $In_xGa_{1-x}N$ (0<x≤1) layer 12 is crystal-grown, without a supply of a $H_2$ gas. With the procedures for stacking the $In_xGa_{1-x}N$ (0<x≤1) layer 12 and the GaN layer 15 being one cycle, four cycles of those stacking procedures are repeated, to form the MQW layer.

Comparative Example 2

The crystal growth method of Comparative Example 2 is the same as the crystal growth method of the embodiment, except that the procedures for growing the GaN layer 11 and the GaN layer 14 shown in FIG. 2 are skipped in the crystal growth of the MQW layer, and the GaN layer 13, the $In_xGa_{1-x}N$ (0<x≤1) layer 12 to be the quantum well layer, and the GaN layer 15 are sequentially grown through the same procedures as those of the embodiment. With the procedures for stacking the GaN layer 13, the $In_xGa_{1-x}N$ (0<x≤1) layer 12, and the GaN layer 15 being one cycle, four cycles of the stacking procedures are repeated, to form the MQW layer.

Comparative Example 3

The crystal growth method of Comparative Example 3 is the same as the crystal growth method of the embodiment, except that, with the stacking procedures for growing the GaN layers 14 and 15 shown in FIG. 2 at a growth temperature of 730° C., which is the same as the growth temperature of the well layer, instead of 850° C. by further adding $H_2$ gas being one cycle, four cycles of the stacking procedures are repeated to form the MQW layer in the crystal growth of the MQW layer.

Comparative Example 4

Figure 4:
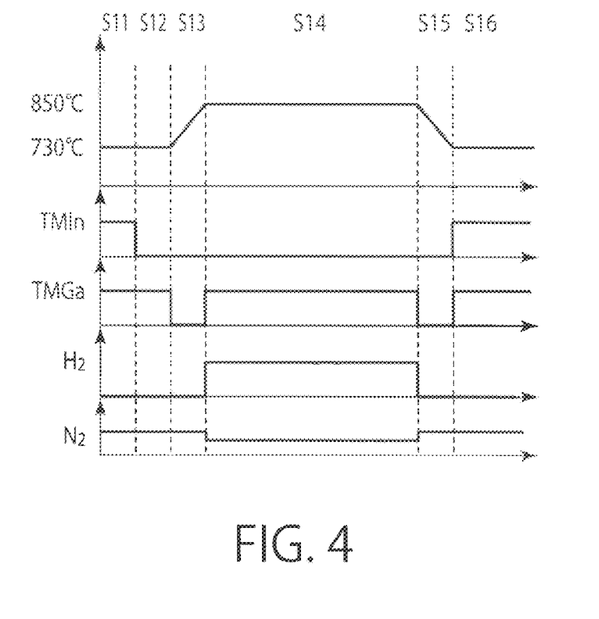
FIG. 4 is a diagram showing the sequences of the materials, carrier gases, and temperatures in the crystal growth of a MQW layer according to Comparative Example 4.
Figure 5:
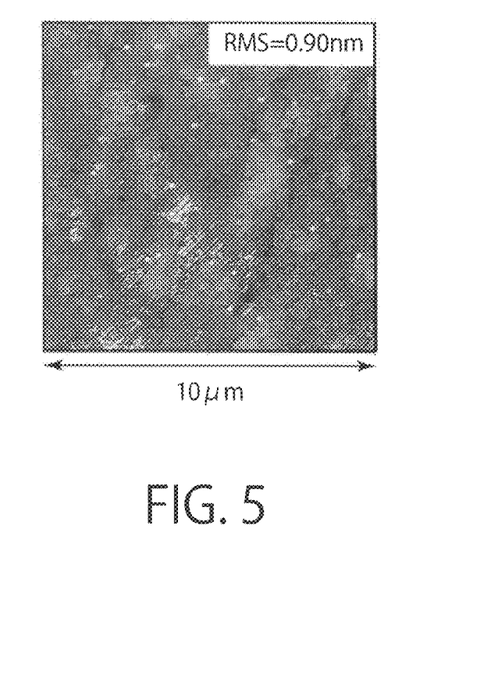
FIG. 5 is a photograph taken when the surface of the MQW layer formed according to the method of an embodiment was observed with an atomic force microscope.
Figure 6:
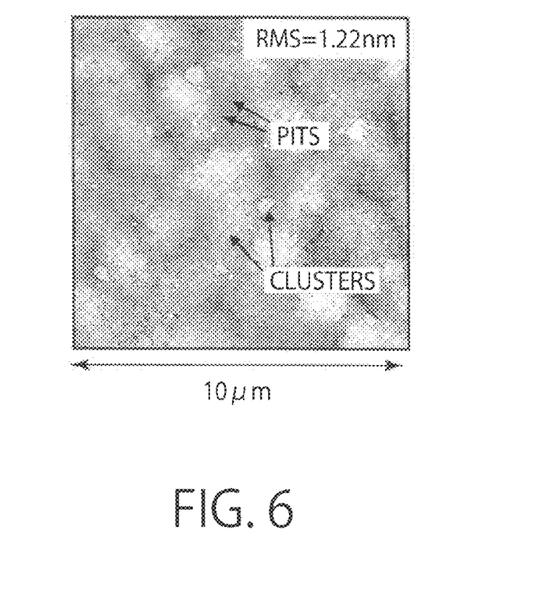
FIG. 6 is a photograph taken when the surface of the MQW layer formed according to the method of Comparative Example 1 was observed with an atomic force microscope.
Figure 7:
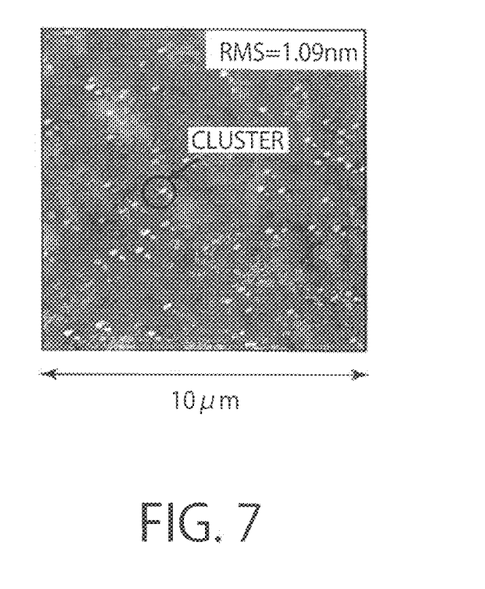
FIG. 7 is a photograph taken when the surface of the MQW layer formed according to the method of Comparative Example 2 was observed with an atomic force microscope.
Figure 8:
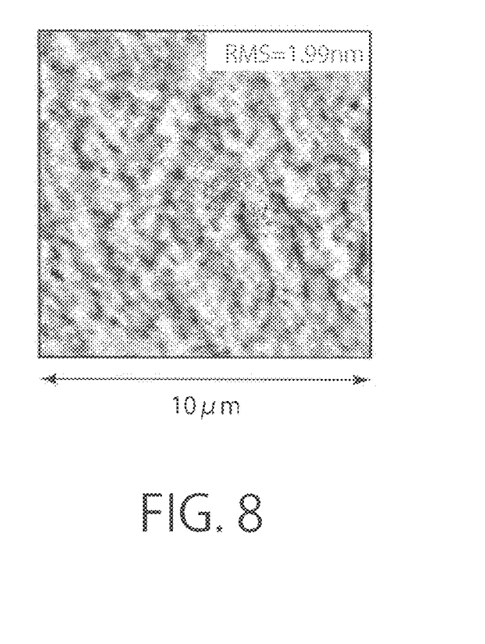
FIG. 8 is a photograph taken when the surface of the MQW layer formed according to the method of Comparative Example 3 was observed with an atomic force microscope.
Figure 9:
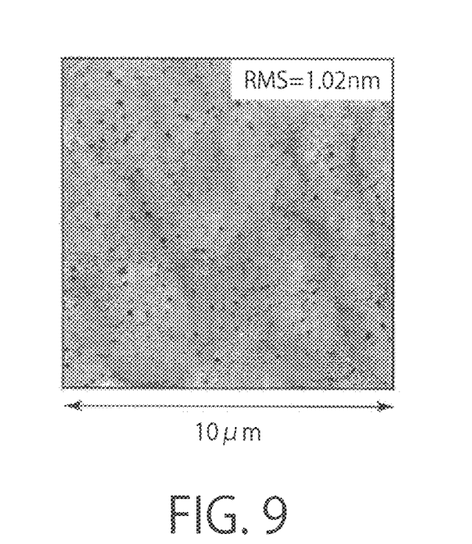
FIG. 9 is a photograph taken when the surface of the MQW layer formed according to the method of Comparative Example 4 was observed with an atomic force microscope.

The crystal growth method of Comparative Example 4 is the same as the crystal growth method of the embodiment, except that, with the stacking procedures for growing the GaN layer 15 shown in FIG. 2 at 850° C. while adding $H_2$ gas being one cycle, four cycles of the stacking procedures are repeated to form the MQW layer in the crystal growth of the MQW layer. The sequences of the materials, the carrier gas, and the temperatures in one cycle of the crystal growth of the MQW layer 6 in Comparative Example 4 are therefore shown as steps S11 through S16 of FIG. 4.

After the MQW layers were grown by the crystal grown methods of the embodiment, Comparative Example 1, Comparative Example 2, Comparative Example 3, and Comparative Example 4, the samples were taken out of the reacting furnace, and the surfaces of the MQW layers were observed with an atomic force microscope (AFM). FIGS. 5 through 9 show the photographs of the observation results. As can be seen from the observation results, the RMS (Root Mean Square) value of the surface height indicating flatness was 0.90 nm in the embodiment, 1.22 nm in Comparative Example 1, 1.09 nm in Comparative Example 2, 1.99 nm in Comparative Example 3, and 1.02 nm in Comparative Example 4. As can be seen from the observation results, the embodiment achieved the flattest surface. The temperature of the barrier layer was made higher in Comparative Example 2 than Comparative Example 1. As can be seen from the results, the RMS value became smaller because of the increase in the temperature of the barrier layer, and the surface was flattened. In Comparative Example 3, $H_2$ gas was added during the growth of the barrier layer, as opposed to Comparative Example 1. However, the concave portions in the surface seen in Comparative Example 1 were even larger in Comparative Example 3, and the surface flatness became poorer due to the addition of $H_2$ gas, though clusters were removed. In Comparative Example 4, the temperature was made higher during the growth of the barrier layer, and $H_2$ gas was added. When the surface was observed, the surface was flattened by the temperature increase, and clusters were removed by the addition of $H_2$ gas. The surface observed in Comparative Example 4 was flatter than that in Comparative Example 1. However, since the addition of $H_2$ gas is continued through the growth of the GaN barrier layer in Comparative Example 4, deep pits were observed with a transmission electron microscope. If a LED is manufactured with such a structure, a current leaks through the deep pits, and hinders light emission from the quantum well layer.

In the embodiment, on the other hand, after clusters are removed by adding $H_2$ gas, a GaN barrier layer is grown at a high temperature without the addition of $H_2$ gas, to form a flat surface. In this manner, the two effects are appropriately achieved at the same time.

This combination of advantageous effects has not been suggested in conventional arts. Compared with Comparative Examples, since GaN barrier layers are grown at a higher temperature, surface migration of the materials at the time of crystal growth is accelerated. Accordingly, pits are effectively filled. Also, $H_2$ gas has the effect to perform etching on InGaN, and it is considered that clusters with high In composition ratios are selectively etched by virtue of $H_2$ gas. With those effects being taken into consideration, clusters are removed by adding $H_2$ gas after the growth of an InGaN layer as the quantum well layer. After that, a GaN layer is grown at a high temperature without the addition of $H_2$ gas. In this manner, the surface can be flattened.

Figure 10:
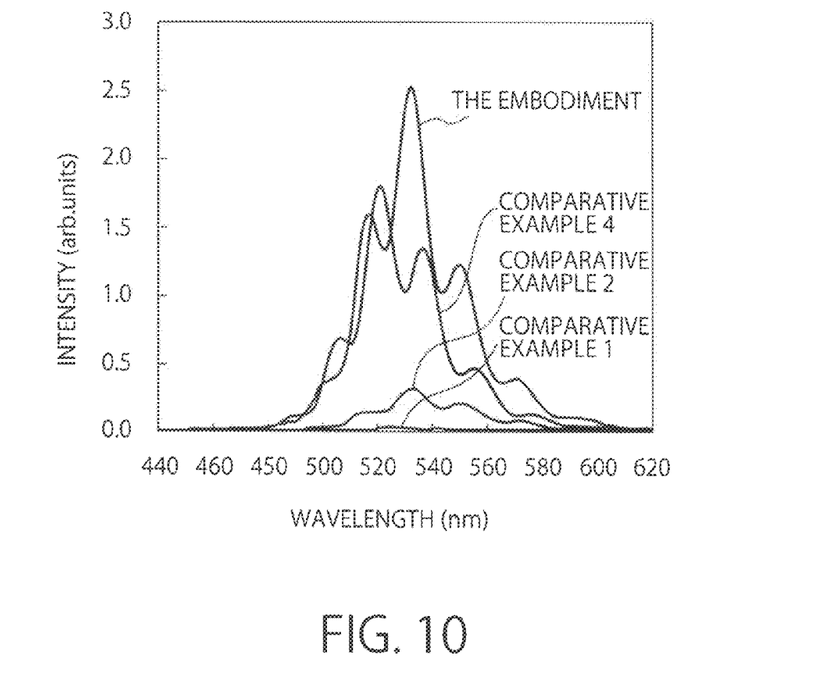
FIG. 10 is a diagram showing the results of PL measurement carried out on the embodiment and Comparative Examples 1 through 4.

The samples of the embodiment and Comparative Examples 1 through 4 were returned into the reacting furnace, and GaN layers were grown at 1030° C. for ten minutes. The conditions that GaN layers are grown at 1030° C. for ten minutes match for forming LED structures the temperature and time conditions for growing a p-type layer on a MQW layer. Therefore, pseudo LED structures were formed. Those samples were then subjected to photoluminescence (PL) measurement. The results are shown in FIG. 10. As can be seen from FIG. 10, the emission intensity from the sample of the embodiment is the highest.

As described above, according to the embodiment, clusters can be removed by adding $H_2$ gas, and a GaN layer is then formed without the addition of $H_2$ gas. In this manner, flattening can be performed through a relatively high-temperature growth. Accordingly, generation of clusters can be restrained, and enlargement of pits can be prevented. As a result, a high-quality nitride semiconductor can be obtained. Also, a crystal growth method for nitride semiconductors that achieves high-efficiency light emission with a high luminance can be achieved, and such a method has great industrial applicability. The crystal growth method of the embodiment can also be applied to the crystal growth of a periodic structure such as the crystal growth of a superlattice layer or a multilayer reflector structure (a distributed bragg reflector (DBR)) that is designed to control strain and reduce threading dislocation density. This embodiment may be applied not only to LEDs, but also to laser diodes (LDs) and light receiving devices.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A crystal growth method for nitride semiconductors, comprising:
   growing a first semiconductor layer containing $In_xGa_{1-x}N$ ($0<x\leq1$) on a substrate at a first growth temperature, with the use of a first carrier gas formed with an inert gas;
   growing a second semiconductor layer containing $In_yGa_{1-y}N$ ($0\leq y<1$, $y<x$) on the first semiconductor layer at a second growth temperature higher than the first growth temperature, with the use of a second carrier gas containing the inert gas and $H_2$ gas, an amount of the $H_2$ gas being smaller than an amount of the inert gas; and
   growing a third semiconductor layer containing $In_zGa_{1-z}N$ ($0\leq z<1$, $z<x$) on the second semiconductor layer at the second growth temperature, with the use of a third carrier gas containing the inert gas and $H_2$ gas, an amount of the $H_2$ gas in the third carrier gas being a smaller than the amount of $H_2$ gas in the second carrier gas.

2. The method according to claim 1, wherein the third semiconductor layer has substantially the same composition as the second semiconductor layer.

3. The method according to claim 1, wherein
   procedures for growing the first semiconductor layer, the second semiconductor layer, and the third semiconductor layer are set as one cycle, and
   a plurality of cycles each being the one cycle are repeated.

4. The method according to claim 1, further comprising growing a fourth semiconductor layer containing $In_uGa_{1-u}N$ ($0\leq u<1$, $u<x$) at the first growth temperature with the use of the first carrier gas before the first semiconductor layer is grown.

5. The method according to claim 1, further comprising growing a fifth semiconductor layer containing $In_vGa_{1-v}N$ ($0\leq v<1$, $v<x$) at the first growth temperature with the use of the first carrier gas after the first semiconductor layer is grown but before the second semiconductor layer is grown.

6. The method according to claim 1, wherein the second and third semiconductor layers are GaN layers.

7. The method according to claim 1, wherein
the first growth temperature is 700° C. or higher but not higher than 850° C., and
the second growth temperature is higher than the first growth temperature by 50° C. or more, and is 800° C. or higher but not higher than 950° C.

\* \* \* \* \*